(12) United States Patent
  Gorday

(10) Patent No.: US 12,620,943 B2
(45) Date of Patent: May 5, 2026

(54) TRANSMITTER SYSTEM WITH HYBRID DIGITAL DRIFT/TRAP COMPENSATION

(71) Applicant: Qorvo US, Inc., Greensboro, NC (US)

(72) Inventor: Paul Edward Gorday, West Palm Beach, FL (US)

(73) Assignee: Qorvo US, Inc., Greensboro, NC (US)

( * ) Notice: Subject to any disclaimer, the term of this patent is extended or adjusted under 35 U.S.C. 154(b) by 597 days.

(21) Appl. No.: 18/151,854

(22) Filed: Jan. 9, 2023

(65) Prior Publication Data

US 2023/0238923 A1     Jul. 27, 2023

Related U.S. Application Data

(60) Provisional application No. 63/390,755, filed on Jul. 20, 2022, provisional application No. 63/301,772, filed on Jan. 21, 2022.

(51) Int. Cl.
  *H03F 1/32*        (2006.01)
  *H03F 1/02*        (2006.01)
        (Continued)

(52) U.S. Cl.
  CPC ......... *H03F 1/3241* (2013.01); *H03F 1/0222* (2013.01); *H03F 1/0233* (2013.01);
        (Continued)

(58) Field of Classification Search
  CPC .... H03F 1/3241; H03F 1/0233; H03F 1/0272; H03F 3/245; H03F 2200/451; H03F 3/19;
        (Continued)

(56) References Cited

U.S. PATENT DOCUMENTS 6,009,317  A  *  12/1999  Wynn ................... H03D 7/168
                                                        455/116
6,252,455  B1 *   6/2001  Kurby .................. H03F 1/0222
                                                        330/136
        (Continued)

FOREIGN PATENT DOCUMENTS

CN        104780132 B  *  7/2018  ........... H04B 1/0475
EP          0885482 B1  *  8/1999  ........... H03F 1/3247
        (Continued)

OTHER PUBLICATIONS

Kenington, P. B., et al., "A GSM-EDGE High Power Amplifier Utilising Digital Linearisation," IEEE MTT-S International Microwave Symposium Digest, May 2001, pp. 1517-1520.
        (Continued)

*Primary Examiner* — Andrea Lindgren Baltzell
*Assistant Examiner* — Lance Torbjorn Bartol
(74) *Attorney, Agent, or Firm* — Withrow & Terranova, P.L.L.C.

(57) ABSTRACT

The present disclosure relates to a transmitter system that includes a radio frequency (RF) power amplifier (PA) and a baseband processor. The RF PA is configured to amplify an RF input signal to an RF output signal and configured to receive an analog bias adjustment signal, which is applied to correct dynamic bias errors in the RF PA caused by amplification variations that have time constants. The baseband processor, in response to an input envelope and a feedback output envelope, is configured to generate a feedback envelope error signal. Herein, the input envelope is estimated based on a baseband input signal received by the baseband processor, and the feedback output envelope is estimated based on the RF output signal. The RF input signal and the analog bias adjustment signal fed to the RF PA are generated
        (Continued)

from the baseband input signal and the feedback envelope error signal, respectively.

22 Claims, 6 Drawing Sheets

(51) Int. Cl.
    *H03F 3/19*           (2006.01)
    *H03F 3/24*           (2006.01)
(52) U.S. Cl.
    CPC ............. *H03F 1/3247* (2013.01); *H03F 3/19* (2013.01); *H03F 3/245* (2013.01); *H03F 2200/102* (2013.01); *H03F 2200/207* (2013.01); *H03F 2200/451* (2013.01)
(58) Field of Classification Search
    CPC ............. H03F 2200/102; H03F 1/0266; H03F 1/0222; H03F 2200/207; H03F 1/3247
    USPC ........................................................ 330/291
    See application file for complete search history.

(56) References Cited

U.S. PATENT DOCUMENTS

| | | | |
|---|---|---|---|
| 7,948,318 | B2 | 5/2011 | Hongo et al. |
| 8,050,353 | B2 | 11/2011 | Sorrells et al. |
| 9,407,476 | B2 | 8/2016 | Lim et al. |
| 2002/0171484 | A1* | 11/2002 | Sundstorm ............ H03F 1/3247 330/136 |
| 2007/0184792 | A1 | 8/2007 | Drogi et al. |
| 2007/0184795 | A1 | 8/2007 | Drogi et al. |
| 2010/0073088 | A1* | 3/2010 | Wimpenny ........... H03F 1/0266 330/199 |
| 2014/0084700 | A1 | 3/2014 | Anderson et al. |
| 2014/0354350 | A1 | 12/2014 | Bowers et al. |
| 2015/0162882 | A1 | 6/2015 | Tam et al. |
| 2015/0236877 | A1 | 8/2015 | Peng et al. |
| 2018/0198424 | A1 | 7/2018 | Sharma et al. |
| 2020/0028469 | A1 | 1/2020 | Chang et al. |
| 2020/0244232 | A1 | 7/2020 | Cope et al. |
| 2021/0344313 | A1 | 11/2021 | Martin et al. |

FOREIGN PATENT DOCUMENTS

| | | | | |
|---|---|---|---|---|
| JP | H07118615 | B2 * | 12/1995 | ............. H03F 3/191 |
| KR | 20010015141 | A * | 2/2001 | ........... H03F 1/0261 |
| KR | 100674586 | B1 * | 1/2007 | ........... H03F 1/3288 |
| WO | WO-9100653 | A1 * | 1/1991 | ........... H03F 1/0227 |

OTHER PUBLICATIONS

Extended European Search Report for European Patent Application No. 23152763.1, mailed Jun. 15, 2023, 11 pages.
Non-Final Office Action for U.S. Appl. No. 17/245,027, mailed Aug. 17, 2023, 7 pages.

* cited by examiner

TRANSMITTER SYSTEM WITH HYBRID DIGITAL DRIFT/TRAP COMPENSATION

RELATED APPLICATIONS

This application claims the benefit of provisional patent application Ser. No. 63/301,772, filed Jan. 21, 2022, and provisional patent application Ser. No. 63/390,755, filed Jul. 20, 2022, the disclosures of which are hereby incorporated herein by reference in their entireties.

FIELD OF THE DISCLOSURE

The present disclosure is related to a transmitter system, within which hybrid digital drift/trap compensation is provided for a radio frequency power amplifier.

BACKGROUND

Present transmitter systems can include a gallium nitride (GaN) device that makes up a controlled radio frequency (RF) power amplifier, a drain-current sensor, circuitry for controlling drain current by manipulating gate voltage of the GaN device, and a baseband processor having a low-speed data bus coupling the baseband processor to a power amplifier module in which the GaN device is integrated. The circuitry for controlling drain current further comprises an analog-to-digital converter for converting the magnitude of the drain current to a digital representation, a digital-to-analog converter for converting the digital representation of a gate bias value to an analog voltage coupled to a gate of the GaN device, and a logic block for, among other things, setting the GaN device gate voltage. A codeplug (one-time programmable) provides settings for the power amplifier control logic block. A negative voltage generator provides a negative voltage to serve as a power supply to generate the gate bias voltage to the GaN device. The negative voltage generator provides a practical means of biasing the GaN device, which is typically depletion mode and requires a negative gate voltage to function correctly.

In operation, these RF amplifier systems can perform pre-wired control functions such as gate-bias generation. However, because stored information is one-time programmable, all characterization must be accomplished during the manufacturing process. The current sense operates only at direct current and so cannot be used when an alternating current signal is present. The power amplifier control logic comprises registers that can be written from the baseband processor, so overrides of codeplug information are possible. All decision-making beyond some simple hard-wired functions must be implemented in the baseband controller. As such, there is a latency between the baseband controller and the power amplifier module. This latency makes mitigation of trapping and drift in transmit devices such as the GaN device unrealizable or at least impractical.

Accordingly, there remains a need for digital drift/trap compensation within the transmitted systems, so as to provide low latency control of devices that comprise RF amplifiers to mitigate charge trapping and drift in the devices.

SUMMARY

The present disclosure relates to a transmitter system, within which hybrid digital drift/trap compensation is provided for a radio frequency power amplifier. The disclosed transmitter system includes a baseband processor and a radio frequency (RF) power amplifier having an amplifier input terminal, an amplifier output terminal, and a bias input terminal. The RF power amplifier is configured to receive an RF input signal at the amplifier input terminal and generate an RF output signal at the amplifier output terminal, the RF output signal being an amplified version of the RF input signal. The RF power amplifier is also configured to receive an analog bias adjustment signal at the bias input terminal, which is applied to correct dynamic bias errors in the RF power amplifier caused by amplification variations that have time constants. The baseband processor, in response to an input envelope and a feedback output envelope, is configured to generate a feedback envelope error signal. Herein, the input envelope is estimated based on a baseband input signal received by the baseband processor, and the feedback output envelope is estimated based on the RF output signal. The RF input signal fed to the amplifier input terminal is generated from the baseband input signal, and the analog bias adjustment signal fed to the bias input terminal is generated from the feedback envelope error signal.

According to one embodiment, the transmitter system further includes an RF-to-baseband converter and a baseband-to-RF converter. Herein, the RF-to-baseband converter is configured to convert the RF output signal from the amplifier output terminal of the RF power amplifier into a feedback modulation signal fed to the baseband processor. The baseband processor is configured to receive the baseband input signal from an input port and the feedback modulation signal from the RF-to-baseband converter, and configured to provide a pre-distorted modulation signal to the baseband-to-RF converter based on the received baseband input signal and the received feedback modulation signal. The baseband-to-RF converter is configured to convert the pre-distorted modulation signal to the RF input signal fed to the amplifier input terminal of the RF power amplifier.

In one embodiment of the transmitter system, the baseband processor includes a modulator, an input envelope detector, a feedback envelope detector, and a compensation block. Herein, the modulator is configured to modulate the baseband input signal to an input modulation signal. The input envelope detector is configured to detect the input envelope of the input modulation signal, and the feedback envelope detector is configured to detect the feedback output envelope of the feedback modulation signal. The compensation block is configured to compare the input envelope with the feedback output envelope to provide the feedback envelope error signal.

In one embodiment of the transmitter system, the baseband processor further includes a digital pre-distorter (DPD), which is configured to compare the input modulation signal from the modulator with the feedback modulation signal from the RF-to-baseband converter to determine how much to distort the input modulation signal thereby distorting the RF input signal to correct nonlinearity of the RF power amplifier.

In one embodiment of the transmitter system, the compensation block includes a first configurable digital gain block, a first summation node, a second configurable digital gain block, and a digital loop filter. Herein, the first configurable digital gain block is configured to apply a first gain to the input envelope to provide a scaled input envelope. The first gain is a gain of the RF power amplifier. The first summation node is configured to provide an error signal, which indicates a difference between the scaled input envelope and the feedback output envelope. The second configurable digital gain block is configured to apply a second gain to the error signal to provide a scaled error signal. The digital loop filter is configured to smooth the scaled error signal to provide the feedback envelope error signal.

In one embodiment of the transmitter system, the compensation block includes a first configurable digital gain block, a first summation node, a second configurable digital gain block, and a digital loop filter. Herein, the first configurable digital gain block is configured to apply a first gain to the feedback output envelope to provide a scaled feedback output envelope. The first gain is an inverse of the gain of the RF power amplifier. The first summation node is configured to provide an error signal, which indicates a difference between the input envelope and the scaled feedback output envelope. The second configurable digital gain block is configured to apply a second gain to the error signal to provide a scaled error signal. The digital loop filter is configured to smooth the scaled error signal to provide the feedback envelope error signal.

According to one embodiment, the transmitter system further includes a bias processor coupled between the baseband processor and the bias input terminal of the RF power amplifier. The bias processor is configured to receive the feedback envelope error signal from the baseband processor and to provide the analog bias adjustment signal to the bias input terminal of the RF power amplifier.

In one embodiment of the transmitter system, the bias processor includes a digital-to-analog converter (DAC) and a DAC conditioning block. Herein, the DAC conditioning block is an interface between the baseband processor and the DAC and is configured to modify the feedback envelope error signal with gaining and/or filtering. The DAC is configured to convert the modified feedback envelope error signal to the analog bias adjustment signal, which is fed to the bias input terminal of the RF power amplifier.

According to one embodiment, an alternative transmitter system includes a baseband processor, a bias processor, and a RF power amplifier having an amplifier input terminal, an amplifier output terminal, and a bias input terminal. The RF power amplifier is configured to receive an RF input signal at the amplifier input terminal and generate an RF output signal at the amplifier output terminal, wherein the RF output signal is an amplified version of the RF input signal. The RF power amplifier is configured to receive an analog bias adjustment signal at the bias input terminal, which is applied to correct dynamic bias errors in the RF power amplifier caused by amplification variations that have time constants. The baseband processor includes a modulator, an input envelope detector, and a digital pre-distorter (DPD). Herein, the modulator is configured to receive a baseband input signal and to provide an input modulation signal based on the baseband input signal. The input envelope detector is configured to detect an input envelope of the input modulation signal. The RF input signal fed to the amplifier input terminal is generated from the baseband input signal. The bias processor is configured to compare the input envelope from the baseband processor and a feedback output envelope estimated from the RF output signal, and to provide the analog bias adjustment signal to the bias input terminal of the RF power amplifier based on the comparison. Notice that the input envelope received by the bias processor does not undergo the DPD.

In one embodiment of the alternative transmitter system, the bias processor comprises an output envelope detector, an output analog-to-digital converter (ADC), and a compensation block. Herein, the output envelope detector has a detector input coupled to the amplifier output terminal of the RF power amplifier and a detector output. The output envelope detector is configured to rectify and filter the RF output signal to generate an average signal envelope. The output ADC is configured to sample the average signal envelope to provide the feedback output envelope. The compensation block has a first compensation input coupled to the baseband processor, a second compensation input coupled to the output ADC, and a compensation output. The compensation block is configured to compare the input envelope from the baseband processor with the feedback output envelope from the output ADC, and to provide a feedback envelope error signal based on the comparison.

In one embodiment of the alternative transmitter system, the bias processor further includes a DAC coupled between the compensation output of the compensation block and the bias input terminal of the RF power amplifier. The DAC is configured to receive the feedback envelope error signal from the compensation block and to convert the feedback envelope error signal into the analog bias signal at the bias input terminal of the RF power amplifier.

According to one embodiment, the alternative transmitter system further includes an output coupler. The detector input of the output envelope detector is coupled to the amplifier output terminal of the RF power amplifier via the output coupler. The output coupler is configured to divert a portion of the RF output signal to the output envelope detector.

In one embodiment of the alternative transmitter system, the compensation block includes a first configurable digital gain block, a first summation node, a second configurable digital gain block, and a digital loop filter. Herein, the first configurable digital gain block is configured to apply a first gain to the input envelope to provide a scaled input envelope. The first gain is a gain of the RF power amplifier. The first summation node is configured to provide an error signal, which indicates a difference between the scaled input envelope and the feedback output envelope. The second configurable digital gain block is configured to apply a second gain to the error signal to provide a scaled error signal. The digital loop filter is configured to smooth the scaled error signal to provide the feedback envelope error signal.

In one embodiment of the alternative transmitter system, the compensation block includes a first configurable digital gain block, a first summation node, a second configurable digital gain block, and a digital loop filter. Herein, the first configurable digital gain block is configured to apply a first gain to the feedback output envelope to provide a scaled feedback output envelope. The first gain is an inverse of the gain of the RF power amplifier. The first summation node is configured to provide an error signal, which indicates a difference between the input envelope and the scaled feedback output envelope. The second configurable digital gain block is configured to apply a second gain to the error signal to provide a scaled error signal. The digital loop filter is configured to smooth the scaled error signal to provide the feedback envelope error signal.

According to one embodiment, the alternative transmitter system further includes an RF-to-baseband converter and a baseband-to-RF converter. Herein, the RF-to-baseband converter is configured to convert the RF output signal from the amplifier output terminal of the RF power amplifier into a feedback modulation signal fed to the baseband processor. The DPD in the baseband processor is configured to provide a pre-distorted modulation signal based on comparing the input modulation signal from the modulator with the feedback modulation signal from the RF-to-baseband converter. The pre-distorted modulation signal is provided from the DPD in the baseband processor to the baseband-to-RF converter. The baseband-to-RF converter is configured to convert the pre-distorted modulation signal to the RF input signal fed to the amplifier input terminal of the RF power amplifier.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
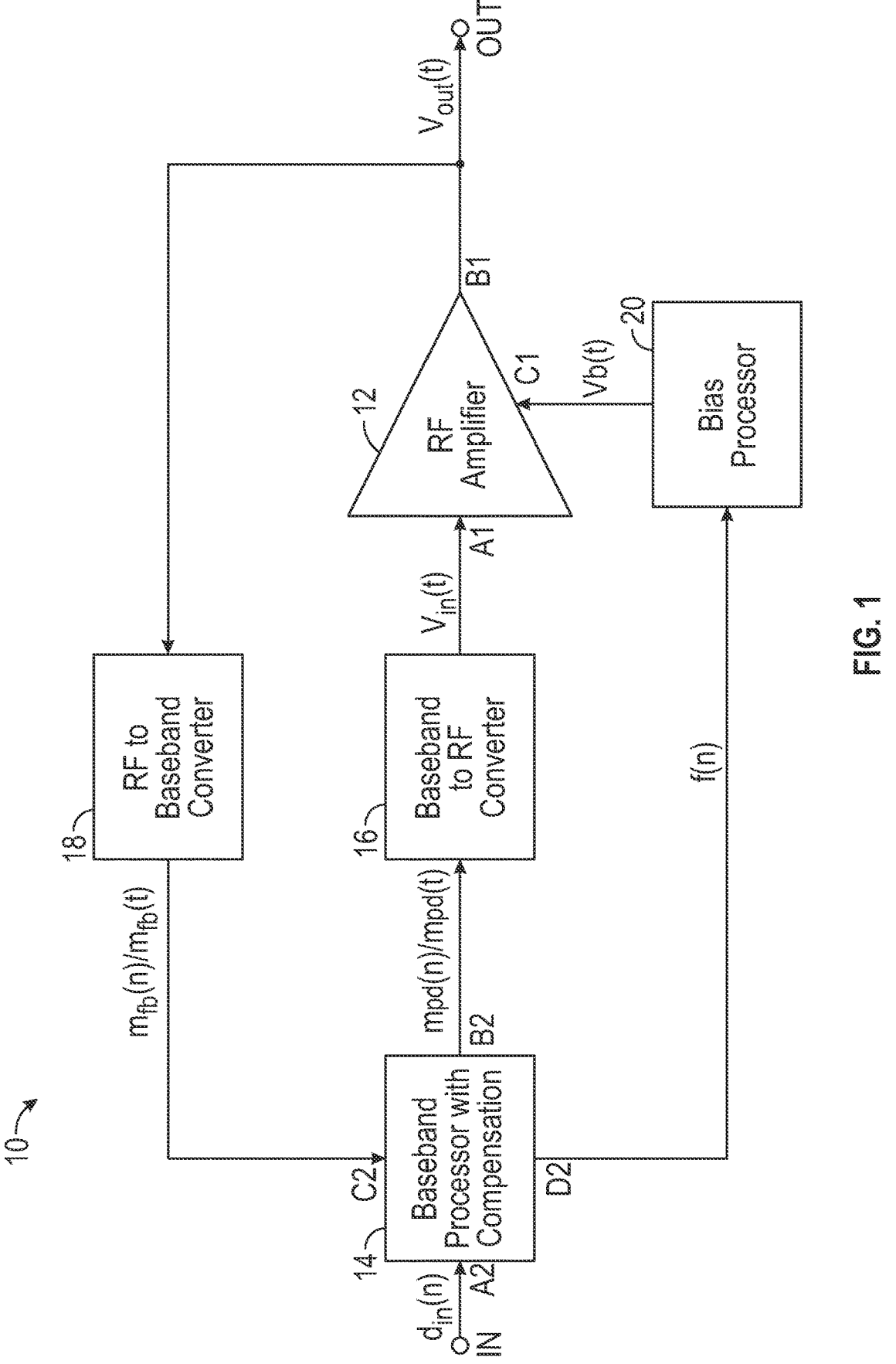
FIG. 1 illustrates a transmitter system with hybrid digital drift/trap compensation according to some embodiments of the present disclosure.

It will be understood that for clear illustrations, FIGS. 1-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 illustrates a transmitter system 10 with hybrid digital drift/trap compensation according to some embodiments of the present disclosure. For the purpose of this illustration, the transmitter system 10 includes a radio frequency (RF) power amplifier 12, a baseband processor 14, a baseband-to-RF converter 16, an RF-to-baseband converter 18, and a bias processor 20. In different applications, the transmitter system 10 may include additional functional circuitry. In this embodiment, besides providing data signals to the RF power amplifier 12, the baseband processor 14 is also configured to compensate for amplifier bias errors in the RF power amplifier 12 by providing a feedback envelope error signal f(n), where the amplifier bias errors in the RF power amplifier 12 are produced by phenomena such as temperature drift, device aging, and charge trapping.

In detail, the RF power amplifier 12 has an amplifier input terminal A1, an amplifier output terminal B1, and a bias input terminal C1. The RF power amplifier 12 is configured to receive an RF input signal $V_{in}(t)$ at the amplifier input A1 from the baseband-to-RF converter 16 and generate an RF output signal $V_{out}(t)$ at the amplifier output terminal B1 toward an output port OUT. Both the RF input signal $v_{in}(t)$ and the RF output signal $V_{out}(t)$ are typically modulated RF carrier signals. The baseband processor 14 has a data input terminal A2, a data output terminal B2, a feedback terminal C2, and an envelope output terminal D2. The baseband processor 14 is configured to receive a digital baseband input signal $d_{in}(n)$ at the data input terminal A2 from an input port IN and receive a feedback modulation signal $m_{fb}$ at the feedback terminal C2 from the RF-to-baseband converter 18, and configured to provide a pre-distorted modulation signal $m_{pd}$ at the data output terminal B2 towards the baseband-to-RF converter 16 based on the received signals $d_{in}(n)$ and $m_{fb}$ (more details discussed in the following paragraphs).

The RF-to-baseband converter 18 is configured to mix the RF output signal $V_{out}(t)$ down to the feedback modulation signal $m_{fb}$. In one embodiment, the feedback modulation signal $m_{fb}$ is a digital signal $m_{fb}(n)$, which is a digital version of an analog feedback modulation signal $m_{fb}(t)$ produced within the RF-to-baseband converter 18, and an analog-to-digital conversion from the analog feedback modulation signal $m_{fb}(t)$ to the digital modulation signal $m_{fb}(n)$ takes place in the RF-to-baseband converter 18. In another embodiment, the feedback modulation signal $m_{fb}$ provided from the RF-to-baseband converter 18 to the baseband processor 14 is the analog feedback modulation signal $m_{fb}(t)$, and the analog-to-digital conversion from the analog feedback modulation signal $m_{fb}(t)$ to the digital feedback modulation signal $m_{fb}(n)$ takes place in the baseband processor 14.

The baseband-to-RF converter 16 is configured to mix the pre-distorted modulation signal $m_{pd}$ up to the RF input signal $V_{in}(t)$ fed to the RF power amplifier 12. In one embodiment, the pre-distorted modulation signal $m_{pd}$ is a digital signal $m_{pd}(n)$, which is a digital version of an analog pre-distorted modulation signal $m_{pd}(t)$ processed within the baseband-to-RF converter 16, and a digital-to-analog conversion from the digital pre-distorted modulation signal $m_{pd}(n)$ to the analog pre-distorted modulation signal $m_{pd}(t)$ takes place in the baseband-to-RF converter 16. In another embodiment, the pre-distorted modulation signal $m_{pd}$ provided from the baseband processor 14 to the baseband-to-RF converter 16 is the analog pre-distorted modulation signal $m_{pd}(t)$, and the digital-to-analog conversion from the digital pre-distorted modulation signal $m_{pd}(n)$ to the analog pre-distorted modulation signal $m_{pd}(t)$ takes place in the baseband processor 16.

In addition, the baseband processor 14 is also configured to detect a feedback output envelope based on the feedback modulation signal $m_{fb}$, and to provide the feedback envelope error signal f(n) at the envelope output terminal D2 towards the bias processor 20 in response to the feedback output envelope (more details discussed in the following paragraphs). Herein, the feedback output envelope represents an envelope level of the RF output signal $V_{out}(t)$. The bias processor 20 is coupled between the envelope output terminal D2 of the baseband processor 14 and the bias input terminal C1 of the RF amplifier 12. The bias processor 20 is configured to receive the feedback envelope error signal f(n) from the envelope output terminal D2 of the baseband processor 14 and to provide an analog bias adjustment signal $V_b(t)$ to the bias input terminal C1 of the RF power amplifier 12 to correct dynamic bias errors in the RF power amplifier 12 caused by amplification variations that have time constants. The amplification variations that have time constants include but are not limited to amplification gain fluctuations due to charge trapping and amplifier gain fluctuations due to temperature changes. The baseband input signal $d_{in}(n)$, the feedback modulation signal $m_{fb}$, the pre-distorted modulation signal $m_{pd}$, and the feedback envelope error signal f(n) are typically signals processed at baseband frequencies.

Figure 2:
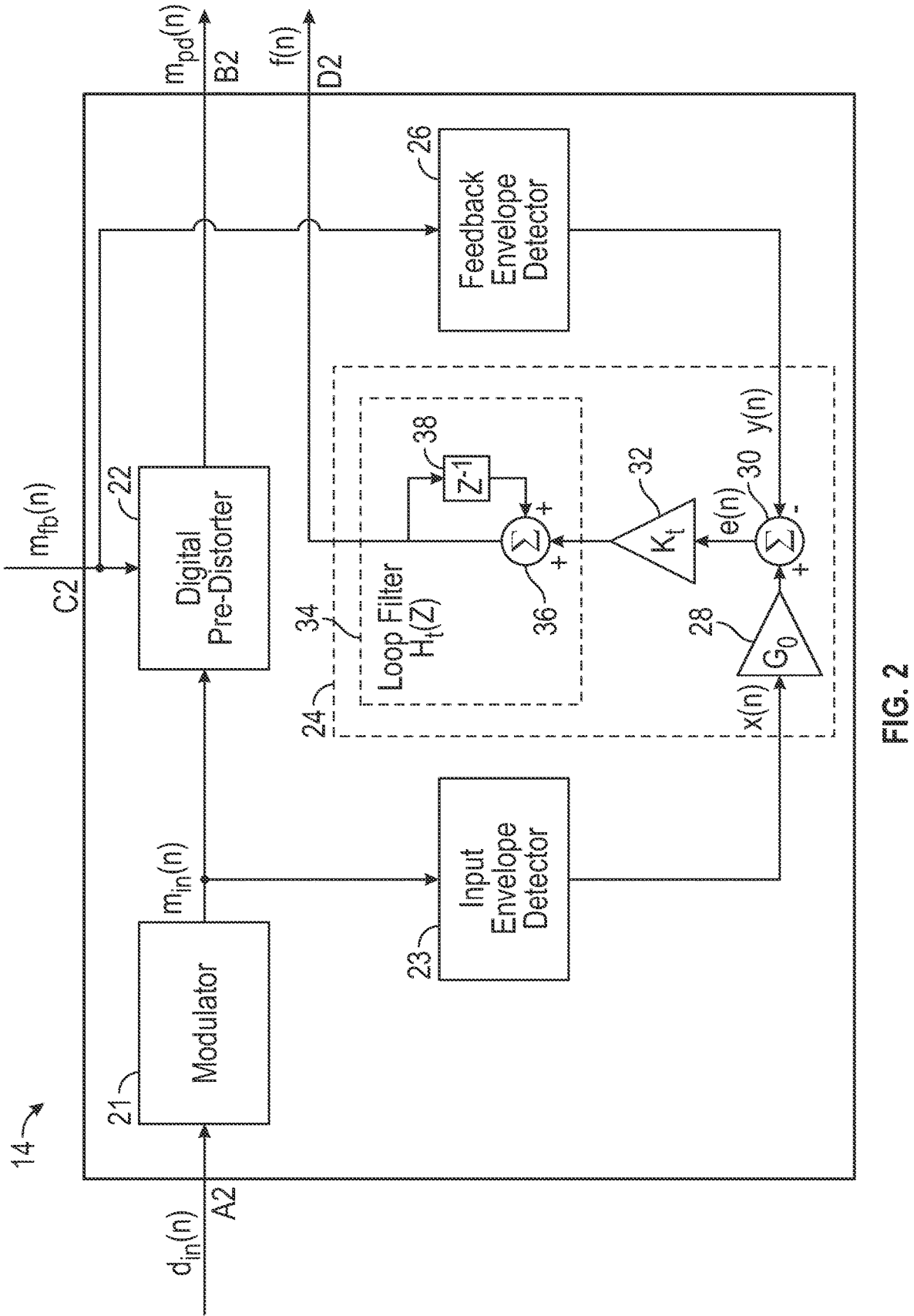
FIG. 2 illustrates a baseband processor within the transmitter system according to some embodiments of the present disclosure.

FIG. 2 illustrates schematic details of the baseband processor 14 within the transmitter system 10 according to some embodiments of the present disclosure. The baseband processor 14 at least includes a modulator 21, a digital pre-distorter (DPD) 22, an input envelope detector 23, a compensation block 24, and a feedback envelope detector 26. Herein, the modulator 21 is configured to modulate the baseband input signal $d_{in}(n)$ (from the input port IN) to an input modulation signal $m_{in}(n)$, which is fed to the DPD 22 and the input envelope detector 23.

The DPD 22 is configured to receive the input modulation signal $m_{in}(n)$ from the modulator 21 and the digital feedback modulation signal $m_{fb}(n)$, and to provide the digital pre-distorted modulation signal $m_{pd}(n)$. For the purpose of this illustration, the feedback modulation signal $m_{fb}$ received by the baseband processor 14 from the RF-to-baseband converter 18 is the digital feedback modulation signal $m_{fb}(n)$ received by the DPD 22, and the pre-distorted modulation signal $m_{pd}$ provided from the baseband processor 14 to the baseband-to-RF converter 16 is the digital pre-distorted modulation signal $m_{pd}(n)$ provided by the DPD 22 (i.e., the analog-to-digital conversion from the analog feedback modulation signal $m_{fb}(t)$ to the digital modulation signal $m_{fb}(n)$ takes place in the RF-to-baseband converter 18, and the digital-to-analog conversion from the digital pre-distorted modulation signal $m_{pd}(n)$ to the analog pre-distorted modulation signal $m_{pd}(t)$ takes place in the baseband-to-RF converter 16). In different applications, when the feedback modulation signal $m_{fb}$ received by the baseband processor 14 from the RF-to-baseband converter 18 is the analog feedback modulation signal $m_{fb}(t)$, the baseband processor 14 may further include a digital-to-analog converter (DAC) to convert the analog feedback modulation signal $m_{fb}(t)$ to the digital feedback modulation signal $m_{fb}(n)$ before being fed to the DPD 22 (not shown). In addition, the pre-distorted modulation signal $m_{pd}$ provided from the baseband processor 14 to the baseband-to-RF converter 16 is the analog pre-distorted modulation signal $m_{pd}(t)$, and the baseband processor 14 may further include an analog-to-digital converter (ADC) to convert the digital pre-distorted modulation signal $m_{pd}(n)$ to the analog pre-distorted modulation signal $m_{pd}(t)$ before being fed to the baseband-to-RF converter 16 (not shown).

By comparing the input modulation signal $m_{in}(n)$ and the digital feedback modulation signal $m_{fb}(n)$, the DPD 22 is capable of determining how much to distort the input modulation signal $m_{in}(n)$ thereby distorting the RF input signal $v_{in}(t)$ to correct nonlinearity of the RF power amplifier 12. Typical DPD implementations compute their coefficients based on observation periods lasting tens of microseconds.

The input envelope detector 23 is configured to provide rectification and filtering of the input modulation signal $m_{in}(n)$ to produce an input envelope $x(n)$. The feedback envelope detector 26 is configured to provide rectification and filtering of the digital feedback modulation signal $m_{fb}(n)$ to produce a feedback output envelope $y(n)$.

The compensation block 24 is configured to compare the input envelope $x(n)$ with the feedback output envelope $y(n)$ to provide the feedback envelope error signal $f(n)$ (to the bias processor 20). The compensation block 24 may be a microprocessor, a digital signal processor, or some other combination of fixed and programmable logic. Within the compensation block 24, a first configurable digital gain block 28 having a first gain $G_0$ is applied to the input envelope $x(n)$, and an error signal $e(n)=G_0x(n)-y(n)$ is output from an error signal output of a first summation node 30. Herein, the first gain $G_0$ might be a gain of the RF power amplifier 12. The gain-adjusted input envelope $G_0x(n)$ acts like a reference signal against which the feedback output envelope $y(n)$ is compared. Alternatively, the first gain $G_0$ may be applied to the feedback output envelope $y(n)$ to form an alternate error signal, $e'(n)=x(n)-G_0y(n)$ without fundamentally changing the functionality of the compensation block 24. Herein, the first gain $G_0$ might be the inverse of the gain of the RF power amplifier 12. In some applications, the input envelope detector 23 and the feedback envelope detector 26 are configured to perform normalization, such that the input envelope $x(n)$ and the feedback output envelope $y(n)$ has a same normalized gain level. The first gain $G_0$ is no longer related to the gain of the RF power amplifier 12, but is a fine-tuning factor. Under nominal conditions, the value of the first gain $G_0$ is determined such that an ideal value of the error signal $e(n)$ is very small (approximately zero). Amplifier bias errors affect the RF output signal $V_{out}(t)$ of the RF power amplifier 12, and consequently affect the feedback output envelope $y(n)$, resulting in a non-zero error signal $e(n)$. The error signal $e(n)$ is scaled by a second configurable digital gain block 32 having a second gain $K_r$. The scaled error signal $K_r{}^*e(n)$ is then smoothed by a digital loop filter 34 to provide the feedback envelope error signal $f(n)$. The digital loop filter 34 has a transfer function $H_r(z)$ and includes a second summation node 36 and a delay register block 38 coupled between an input to the second summation node 36 and an output of the second summation node 36. The second summation node 36 sums a scaled error signal $K_r{}^*e(n)$ that is output from the second configurable digital gain block 32 with a feedback output of the delay register block 38. It is to be understood that the $Z^{-1}$ notation in FIG. 2 represents the z-transform of a single-sample delay. It is also to be understood that other filter structures in place of the loop filter 34 may be used.

Figure 3:
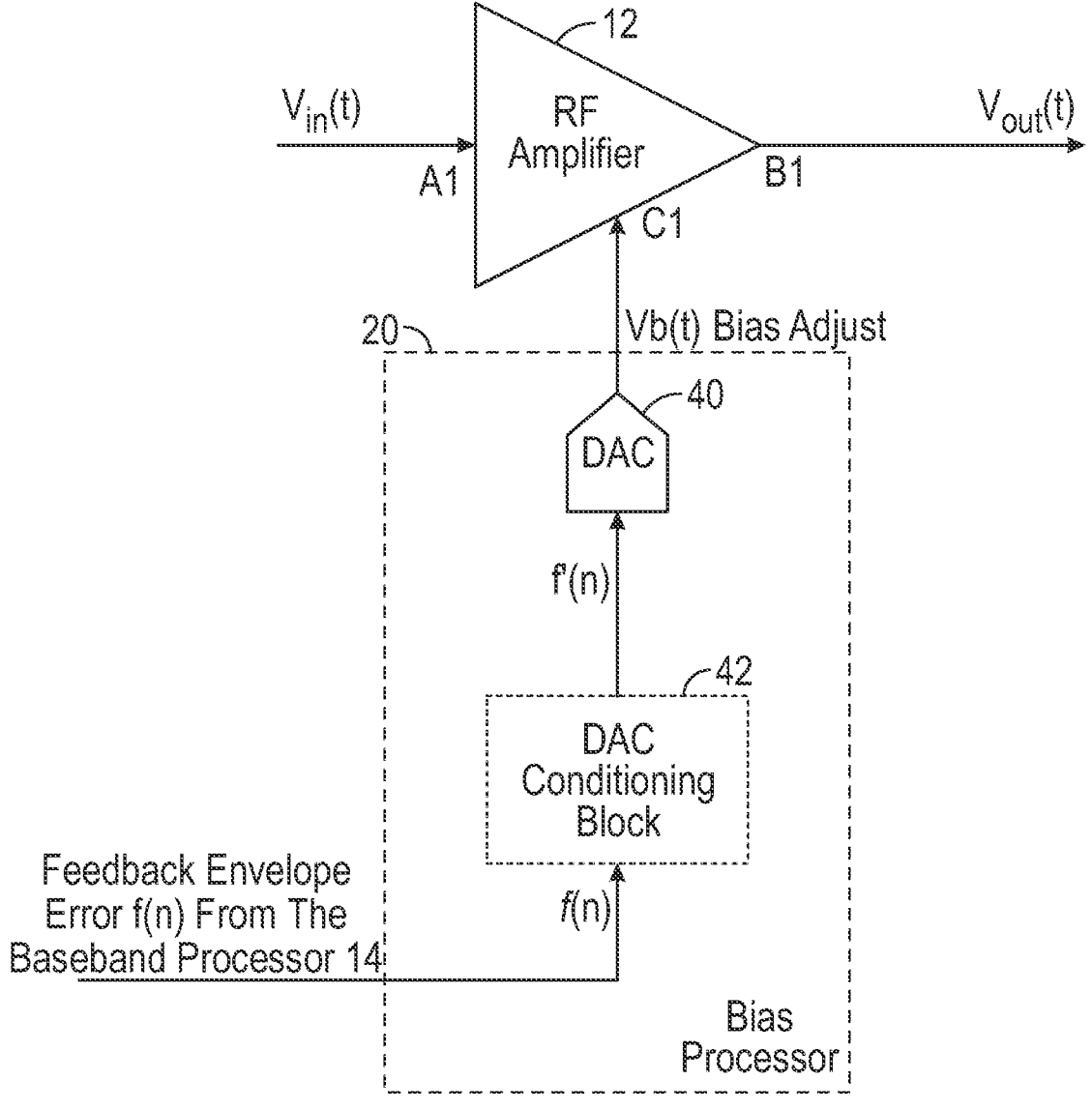
FIG. 3 illustrates a bias processor within the transmitter system according to some embodiments of the present disclosure.

The feedback envelope error signal $f(n)$ is fed to the bias processor 20 and is converted to the analog bias adjustment signal, $V_b(t)$, which is applied to bias the RF power amplifier 12. FIG. 3 illustrates the bias processor 20 within the transmitter system 10 according to some embodiments of the present disclosure. The bias processor 20 includes a DAC 40 and an optional DAC conditioning block 42. Herein, the DAC conditioning block 42 is an interface between the baseband processor 14 and the DAC 40, and is configured to provide gaining and/or filtering to the feedback envelope error signal $f(n)$. A modified feedback envelope error signal $f'(n)$ provided by the DAC conditioning block 42 is then converted to the analog bias adjustment signal, $V_b(t)$, by the DAC 40. The analog bias adjustment signal, $V_b(t)$, is applied to bias the RF power amplifier 12. The polarity of the bias adjustment is such that $V_b(t)$ acts to reduce the bias error within the RF power amplifier 12. As such, the transmitter system 10 is a closed-loop feedback control type system that realizes the objective to mitigate bias errors and thereby minimize variations in gain and linearity characteristics of the RF power amplifier 12.

Figure 4:
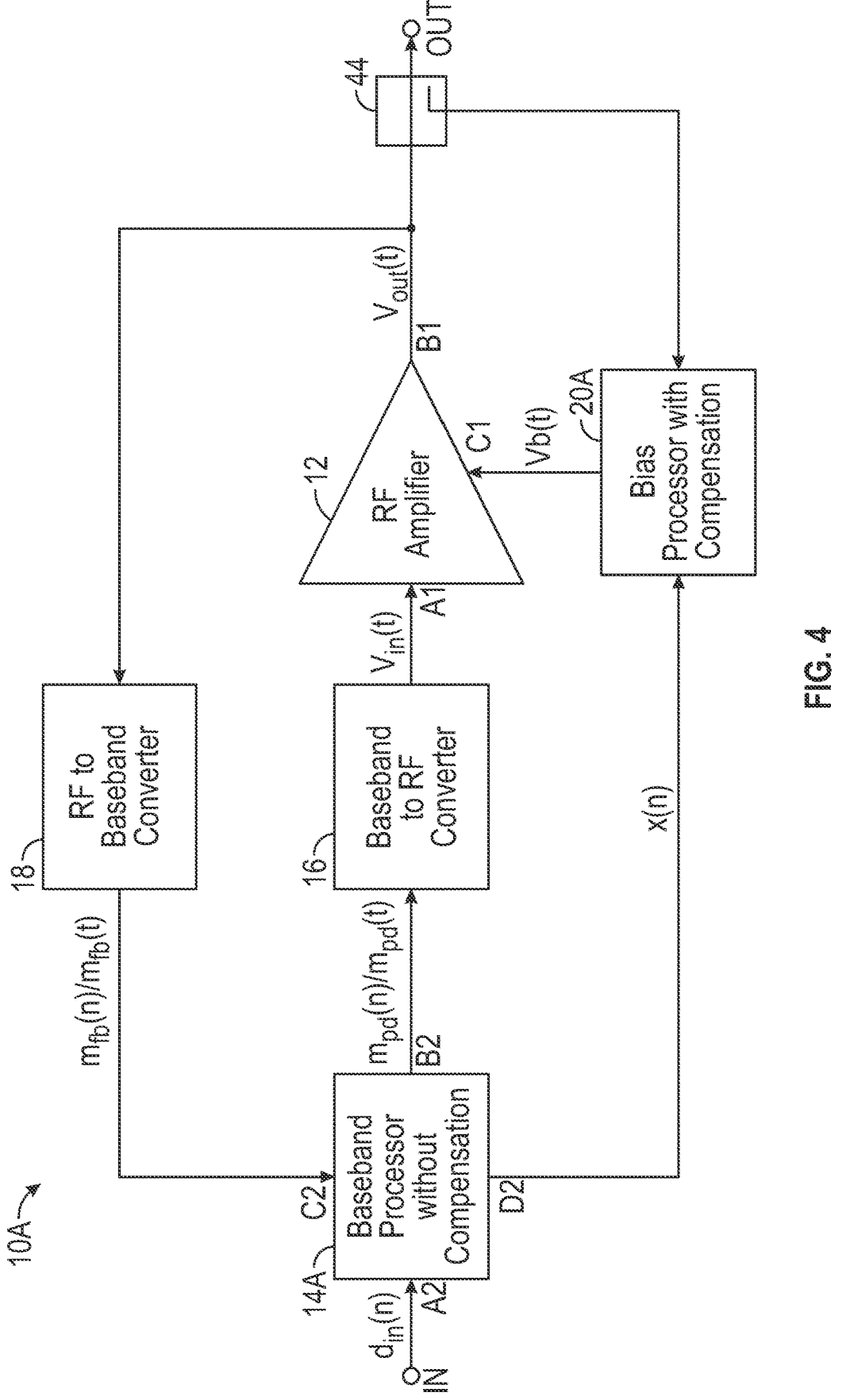
FIG. 4 illustrates an alternative transmitter system with hybrid digital drift/trap compensation according to some embodiments of the present disclosure.

In the transmitter system 10, the compensation functionality is achieved by the bandpass processor 14 (in particular, achieved by the compensation block 24 within the bandpass processor 14). The baseband processor 14 compares the input envelope $x(n)$ with the feedback output envelope $y(n)$ and provides the feedback envelope error signal $f(n)$ to compensate for amplifier bias errors in the RF power amplifier 12. In different applications, the compensation functionality may be performed by another processor. FIG. 4 illustrates an alternative transmitter system 10A with hybrid digital drift/trap compensation according to some embodiments of the present disclosure. The alternative transmitter system 10A includes the RF power amplifier 12, an alternative baseband processor 14A, the baseband-to-RF converter 16, the RF-to-baseband converter 18, an alternative bias processor 20A, and an output coupler 44, which diverts a small amount of the RF output signal $V_{out}(t)$ power to the alternative bias processor 20A without significant loss or degradation of the performance of the RF power amplifier 12. Herein, the alternative baseband processor 14A does not perform the compensation functionality, while the alternative bias processor 20A performs the compensation functionality.

Similar to the baseband processor 14, the alternative baseband processor 14A is also configured to receive the baseband input signal $d_{in}(n)$ at the data input terminal A2 from the input port IN and the feedback modulation signal $m_{fb}$ at the feedback terminal C2 from the RF-to-baseband converter 18, and configured to provide the pre-distorted modulation signal $m_{pd}$ at the data output terminal B2 towards the baseband-to-RF converter 16 based on the received signals $d_{in}(n)$ and $m_{fb}$. However, the alternative baseband processor 14A does not provide the feedback envelope error signal $f(n)$. Instead, the alternative baseband processor 14A provides, at the envelope output terminal D2, the input envelope $x(n)$ directly to the alternative bias processor 20A, where the input envelope $x(n)$ represents a clean modulation envelope level prior to the DPD 22. The alternative bias processor 20A is configured to compare the input envelope $x(n)$ from the alternative baseband processor 14A with envelope information of the RF output signal $V_{out}(t)$ from the amplifier output terminal B1 of the RF power amplifier 12, and to provide the analog bias adjustment signal $V_b(t)$ to the RF power amplifier 12 to correct dynamic bias errors in the RF power amplifier 12 caused by amplification variations.

Figure 5:
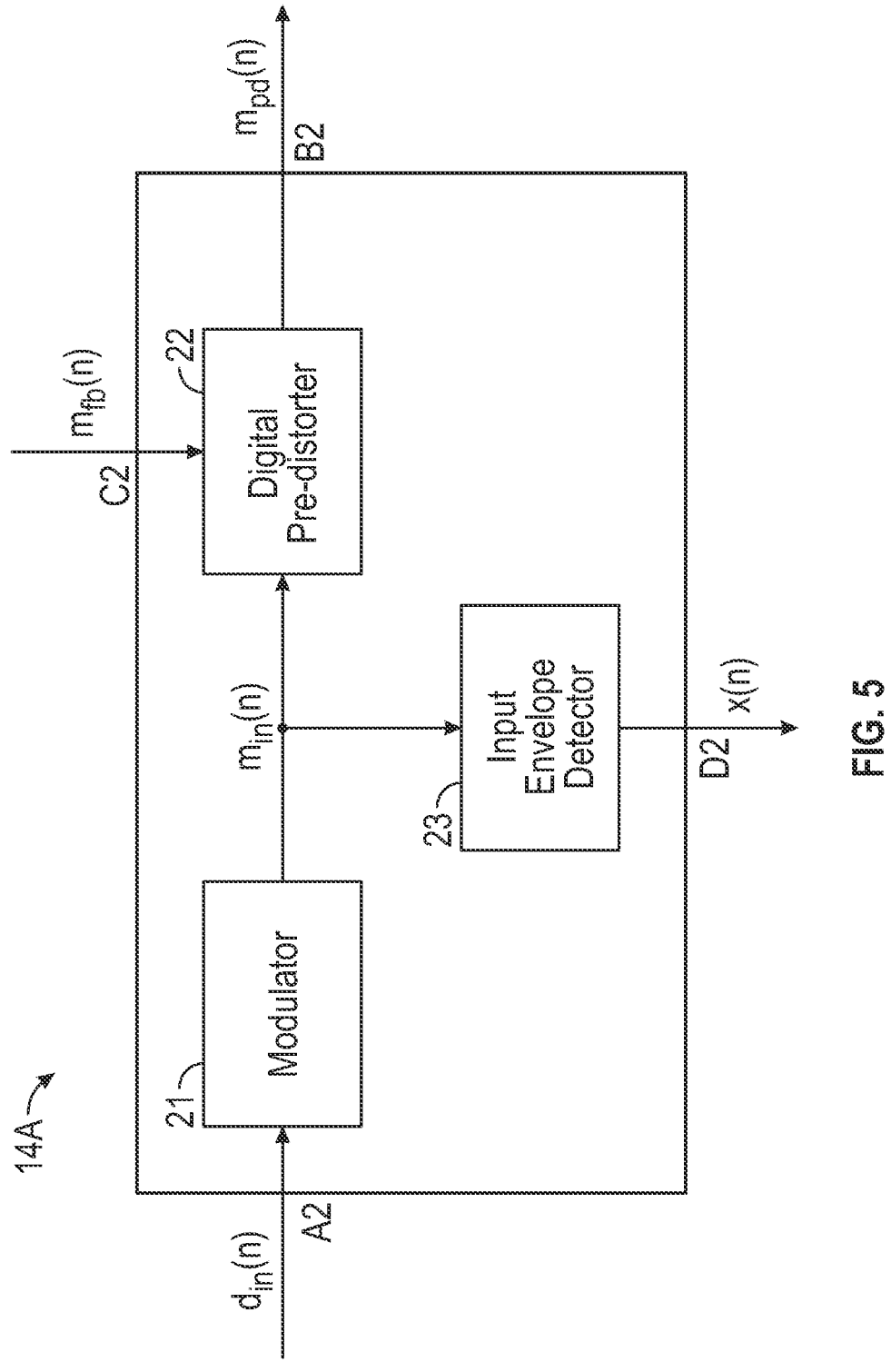
FIG. 5 illustrates an alternative baseband processor within the alternative transmitter system according to some embodiments of the present disclosure.

FIG. 5 illustrates the alternative baseband processor 14A within the alternative transmitter system 10A according to some embodiments of the present disclosure. Similar to the baseband processor 14, the alternative baseband processor 14A still includes the modulator 21, the DPD 22, and the input envelope detector 23. The modulator 21 is configured to modulate the baseband input signal $d_{in}(n)$ to the input modulation signal $m_{in}(n)$. The DPD 22 is configured to generate the digital pre-distorted modulation signal $m_{pd}(n)$ to drive the baseband-to-RF converter 16 based on the received input modulation signal $m_{in}(n)$ and the digital feedback modulation signal $m_{fb}(n)$. By comparing the input modulation signal $m_{in}(n)$ with the digital feedback modulation signal $m_{fb}(n)$, the DPD 22 is capable of determining how much to distort the input modulation signal $m_{in}(n)$ thereby distorting the RF input signal $v_{in}(t)$ to correct nonlinearity of the RF power amplifier 12.

Different from the baseband processor 14, the alternative baseband processor 14A does not include the compensation block 24 and the feedback envelope detector 26, and does not perform a comparison between the input envelope $x(n)$ and the feedback output envelope $y(n)$. The alternative baseband processor 14A provides the input envelope $x(n)$ based on the clean input modulation signal $m_{in}(n)$ directly to the alternative bias processor 20A. Notice that the input envelope $x(n)$ does not undergo the DPD 22, which would be a clean reference signal to compare with the feedback output envelope $y(n)$. If the input envelope $x(n)$ has undergone through the DPD 22 before comparing with the feedback output envelope $y(n)$, the comparison is sub-optimum, since the envelope error also includes pre-distortion generated by the DPD 22.

For the purpose of this illustration, the feedback modulation signal $m_{fb}$ received by the alternative baseband processor 14A from the RF-to-baseband converter 18 is the digital feedback modulation signal $m_{fb}(n)$ received by the DPD22, and the pre-distorted modulation signal $m_{pd}$ provided from the alternative baseband processor 14A to the baseband-to-RF converter 16 is the digital pre-distorted modulation signal $m_{pd}(n)$ provided by the DPD 22 (i.e., the analog-to-digital conversion from the analog feedback modulation signal $m_{fb}(t)$ to the digital modulation signal $m_{fb}(n)$ takes place in the RF-to-baseband converter 18, and the digital-to-analog conversion from the digital pre-distorted modulation signal $m_{pd}(n)$ to the analog pre-distorted modulation signal $m_{pd}(t)$ takes place in the baseband-to-RF converter 16). In different applications, when the feedback modulation signal $m_{fb}$ received by the alternative baseband processor 14A from the RF-to-baseband converter 18 is the analog feedback modulation signal $m_{fb}(t)$, the alternative baseband processor 14A may further include a digital-to-analog converter (DAC) to convert the analog feedback modulation signal $m_{fb}(t)$ to the digital feedback modulation signal $m_{fb}(n)$ before being fed to the DPD 22 (not shown). In addition, the pre-distorted modulation signal $m_{pd}$ provided from the alternative baseband processor 14A to the baseband-to-RF converter 16 is the analog pre-distorted modulation signal $m_{pd}(t)$, and the alternative baseband processor 14A may further include an analog-to-digital converter (ADC) to convert the digital pre-distorted modulation signal $m_{pd}(n)$ to the analog pre-distorted modulation signal $m_{pd}(t)$ before being fed to the baseband-to-RF converter 16 (not shown).

Figure 6:
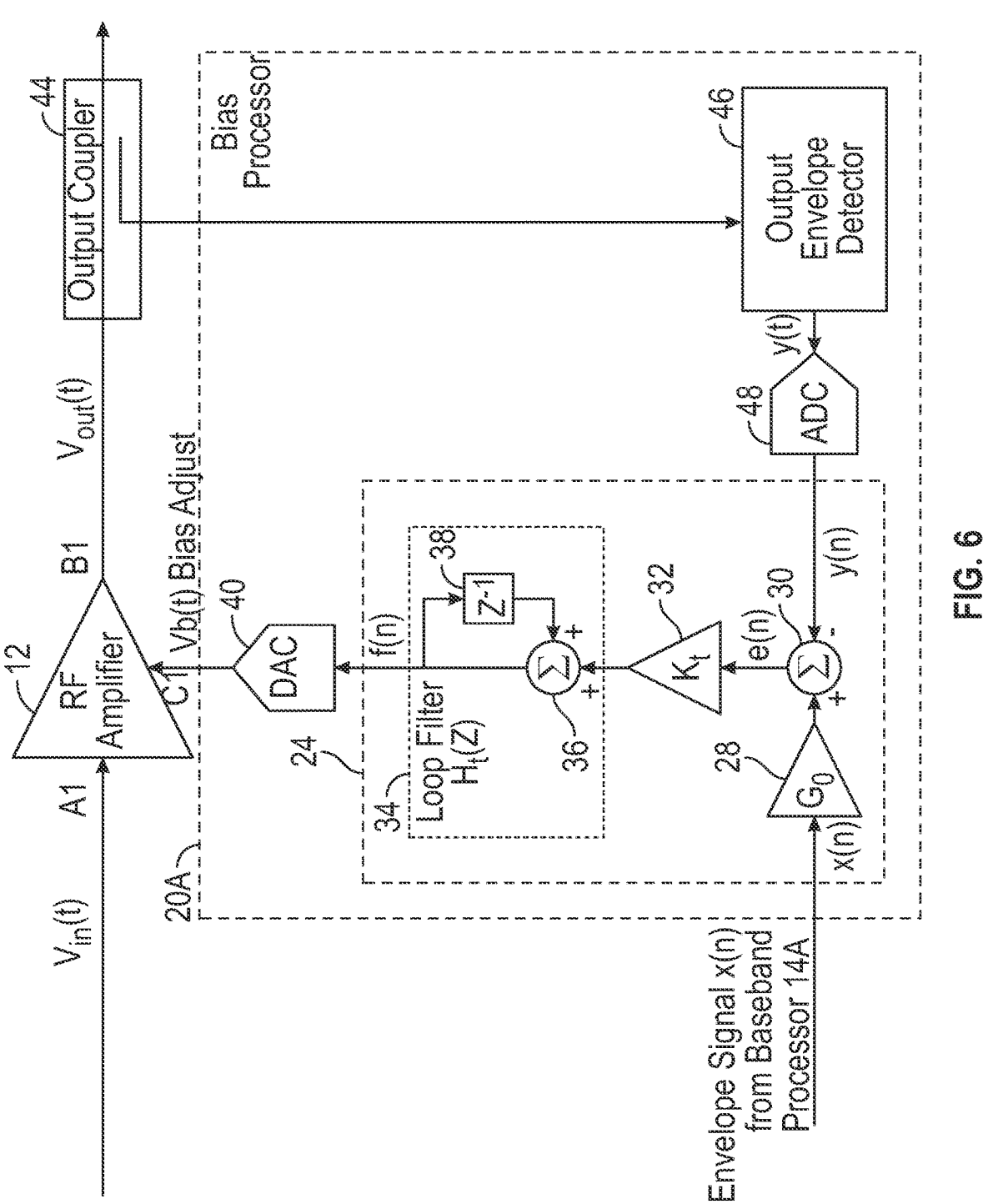
FIG. 6 illustrates an alternative bias processor within the alternative transmitter system according to some embodiments of the present disclosure.

In the alternative transmitter system 10A, the alternative bias processor 20A is configured to compensate for amplifier bias errors in the RF power amplifier 12 by providing the analog bias adjustment signal $V_b(t)$ to the RF power amplifier 12 based on a comparison between the input envelope $x(n)$ and the envelope information of the RF output signal $V_{out}(t)$. The analog bias adjustment signal $V_b(t)$ corrects the dynamic bias errors in the RF power amplifier 12 caused by amplification variations that have time constants. FIG. 6 illustrates schematic details of the alternative bias processor 20A within the alternative transmitter system 10A according to some embodiments of the present disclosure.

The alternative bias processor 20A includes an output envelope detector 46, an output ADC 48, the compensation block 24, and the DAC 40. Herein, the output coupler 44 is coupled to the amplifier output terminal B1 of the RF power amplifier 12 and has an output signal tap coupled to the output envelope detector 46 of the alternative bias processor 20A. The output envelope detector 46 is configured to provide rectification and filtering of the RF output signal $V_{out}(t)$ to estimate an average signal envelope $y(t)$. The output ADC 48 is coupled between the output envelope detector 46 and the compensation block 24, and configured to sample the average signal envelope $y(t)$ to the feedback output envelope $y(n)$.

Herein, the compensation block 24 within the alternative bias processor 20A acts the same as the compensation block 24 within the baseband processor 14 shown in FIG. 2. The compensation block 24 is configured to compare the input envelope $x(n)$, which does not undergo the DPD 22, from the alternative baseband processor 14A with the feedback output envelope $y(n)$, which represents the modulation envelope of the RF output signal $V_{out}(t)$, from the output ADC 48, and to provide the feedback envelope error signal $f(n)$ to the DAC 40 based on the comparison. Within the compensation block 24, the first configurable digital gain block 28 having the first gain $G_0$ is applied to the input envelope $x(n)$, and the error signal $e(n)=G_0x(n)-y(n)$ is output from the error signal output of the first summation node 30. Herein, the first gain $G_0$ might be the gain of the RF power amplifier 12. The gain-adjusted input envelope $G_0x(n)$ acts like the reference signal against which the feedback output envelope $y(n)$ is compared. Alternatively, the first gain $G_0$ may be applied to the feedback output envelope $y(n)$ to form the alternate error signal, $e'(n)=x(n)-G_0y(n)$, without fundamentally changing the functionality of the compensation block 24. Herein, the first gain $G_0$ might be the inverse of the gain of the RF power amplifier 12. In some applications, the output envelope detector 46 is configured to normalize the average signal envelope $y(t)$, such that the sampled feedback output envelope $y(n)$ has a same normalized gain level as the input envelope $x(n)$. Thus, the first gain $G_0$ is not related to the gain of the RF power amplifier 12, but is a fine-tuning factor. Under nominal conditions the value of the first gain $G_0$ is determined such that an ideal value of the error signal $e(n)$ is very small (approximately zero).

Amplifier bias errors affect the RF output signal $V_{out}(t)$ of the RF power amplifier 12, and consequently affect the feedback output envelope $y(n)$, resulting in a non-zero error signal $e(n)$. The error signal $e(n)$ is scaled by a second configurable digital gain block 32 having a second gain $K_r$. The scaled error signal $K_r*e(n)$ is then smoothed by the digital loop filter 34 to provide the feedback envelope error signal $f(n)$. The feedback envelope error signal $f(n)$ is fed to the DAC 40 and is converted to the analog bias adjustment signal, $V_b(t)$, which is applied to bias the RF power amplifier 12. The polarity of the bias adjustment is such that $V_b(t)$ acts to reduce the bias error in the RF power amplifier 12. As such, the alternative transmitter system 10A is a closed-loop feedback control type system that realizes the objective to mitigate bias errors and thereby minimize variations in gain and linearity characteristics of the RF power amplifier 12.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A transmitter system comprising:
   a radio frequency (RF) power amplifier (PA) having an amplifier input terminal, an amplifier output terminal, and a bias input terminal, wherein:
      the RF PA is configured to receive an RF input signal at the amplifier input terminal and generate an RF output signal at the amplifier output terminal, wherein the RF output signal is an amplified version of the RF input signal; and
      the RF PA is configured to receive an analog bias adjustment signal at the bias input terminal, which is applied to correct dynamic bias errors in the RF PA caused by amplification variations that have time constants; and
   a baseband processor, in response to an input envelope and a feedback output envelope, configured to generate a feedback envelope error signal, wherein:
      the input envelope is estimated by detecting an input modulation signal, which corresponds to a baseband input signal received by the baseband processor, and the feedback output envelope is estimated by detecting a feedback modulation signal, which corresponds to the RF output signal and is received by the baseband processor, wherein the input modulation signal and the feedback modulation signal are baseband signals having lower frequencies than the RF input signal;
      the RF input signal fed to the amplifier input terminal is generated from the baseband input signal; and
      the analog bias adjustment signal fed to the bias input terminal is generated from the feedback envelope error signal.

2. The transmitter system of claim 1 further comprises an RF-to-baseband converter, wherein:
   the RF-to-baseband converter is configured to convert the RF output signal from the amplifier output terminal of the RF PA down to the feedback modulation signal fed to the baseband processor; and
   the baseband processor is configured to receive the baseband input signal from an input port and the feedback modulation signal from the RF-to-baseband converter and configured to provide a pre-distorted modulation signal based on the received baseband input signal and the received feedback modulation signal.

3. The transmitter system of claim 2 further comprises a baseband-to-RF converter, wherein:
   the pre-distorted modulation signal is provided from the baseband processor to the baseband-to-RF converter; and
   the baseband-to-RF converter is configured to convert the pre-distorted modulation signal up to the RF input signal fed to the amplifier input terminal of the RF PA.

4. The transmitter system of claim 2 wherein the baseband processor includes a modulator, wherein the modulator is configured to modulate the baseband input signal to the input modulation signal.

5. The transmitter system of claim 4 wherein the baseband processor further includes a digital pre-distorter (DPD), which is configured to compare the input modulation signal from the modulator with the feedback modulation signal from the RF-to-baseband converter to determine how much to distort the input modulation signal thereby distorting the RF input signal to correct nonlinearity of the RF PA, wherein the estimation of the input envelope is independent of the DPD.

6. The transmitter system of claim 4 wherein the baseband processor further includes an input envelope detector, a feedback envelope detector, and a compensation block, wherein:
   the input envelope detector is configured to detect the input envelope of the input modulation signal, and the feedback envelope detector is configured to detect the feedback output envelope of the feedback modulation signal; and
   the compensation block is configured to compare the input envelope with the feedback output envelope to provide the feedback envelope error signal.

7. The transmitter system of claim 6 wherein the compensation block includes a first configurable digital gain block, a first summation node, a second configurable digital gain block, and a digital loop filter, wherein:
   the first configurable digital gain block is configured to apply a first gain to the input envelope to provide a scaled input envelope;
   the first summation node is configured to provide an error signal, which indicates a difference between the scaled input envelope and the feedback output envelope;
   the second configurable digital gain block is configured to apply a second gain to the error signal to provide a scaled error signal; and
   the digital loop filter is configured to smooth the scaled error signal to provide the feedback envelope error signal.

8. The transmitter system of claim 7 wherein the first gain is a gain of the RF PA.

9. The transmitter system of claim 6 wherein the compensation block includes a first configurable digital gain block, a first summation node, a second configurable digital gain block, and a digital loop filter, wherein:
   the first configurable digital gain block is configured to apply a first gain to the feedback output envelope to provide a scaled feedback output envelope;
   the first summation node is configured to provide an error signal, which indicates a difference between the input envelope and the scaled feedback output envelope;
   the second configurable digital gain block is configured to apply a second gain to the error signal to provide a scaled error signal; and
   the digital loop filter is configured to smooth the scaled error signal to provide the feedback envelope error signal.

10. The transmitter system of claim 9 wherein the first gain is an inverse of a gain of the RF PA.

11. The transmitter system of claim 1 further comprising a bias processor coupled between the baseband processor and the bias input terminal of the RF PA, wherein the bias processor is configured to receive the feedback envelope error signal from the baseband processor and to provide the analog bias adjustment signal to the bias input terminal of the RF PA.

12. The transmitter system of claim 11 wherein the bias processor includes a digital-to-analog converter (DAC) and a DAC conditioning block, wherein:
   the DAC conditioning block is an interface between the baseband processor and the DAC, and is configured to modify the feedback envelope error signal with at least one of gaining and filtering; and the DAC is configured to convert the modified feedback envelope error signal to the analog bias adjustment signal, which is fed to the bias input terminal of the RF PA.

13. A transmitter system comprising:

a radio frequency (RF) power amplifier (PA) having an amplifier input terminal, an amplifier output terminal, and a bias input terminal, wherein:

the RF PA is configured to receive an RF input signal at the amplifier input terminal and generate an RF output signal at the amplifier output terminal, wherein the RF output signal is an amplified version of the RF input signal; and the RF PA is configured to receive an analog bias adjustment signal at the bias input terminal, which is applied to correct dynamic bias errors in the RF PA caused by amplification variations that have time constants;

a baseband processor comprising a modulator, an input envelope detector, and a digital pre-distorter (DPD), wherein:

the modulator is configured to receive a baseband input signal and provide an input modulation signal based on the baseband input signal; wherein the input modulation signal is fed to both the input envelope detector and the DPD;

the input envelope detector is configured to detect an input envelope of the input modulation signal, wherein the input modulation signal is a baseband signal having a lower frequency than the RF input signal; and the RF input signal fed to the amplifier input terminal is generated from the baseband input signal; and a bias processor configured to compare the input envelope from the baseband processor and a feedback output envelope estimated from the RF output signal, and to provide the analog bias adjustment signal to the bias input terminal of the RF PA based on the comparison, wherein the input envelope received by the bias processor does not undergo the DPD.

14. The transmitter system of claim 13 wherein the bias processor comprises:

an output envelope detector having a detector input coupled to the amplifier output terminal of the RF PA and a detector output, wherein the output envelope detector is configured to rectify and filter the RF output signal to generate an average signal envelope;

an output analog-to-digital converter (ADC) configured to sample the average signal envelope to provide the feedback output envelope; and a compensation block having a first compensation input coupled to the baseband processor, a second compensation input coupled to the output ADC, and a compensation output, wherein the compensation block is configured to compare the input envelope from the baseband processor with the feedback output envelope from the output ADC, and to provide a feedback envelope error signal based on the comparison.

15. The transmitter system of claim 14 wherein the bias processor further comprises a digital-to-analog converter (DAC) coupled between the compensation output of the compensation block and the bias input terminal of the RF PA, wherein the DAC is configured to receive the feedback envelope error signal from the compensation block and to convert the feedback envelope error signal into the analog bias signal at the bias input terminal of the RF PA.

16. The transmitter system of claim 14 further comprising an output coupler, wherein:

the detector input of the output envelope detector is coupled to the amplifier output terminal of the RF PA via the output coupler; and the output coupler is configured to divert a portion of the RF output signal to the output envelope detector.

17. The transmitter system of claim 14 wherein the compensation block includes a first configurable digital gain block, a first summation node, a second configurable digital gain block, and a digital loop filter, wherein:

the first configurable digital gain block is configured to apply a first gain to the input envelope to provide a scaled input envelope;

the first summation node is configured to provide an error signal, which indicates a difference between the scaled input envelope and the feedback output envelope;

the second configurable digital gain block is configured to apply a second gain to the error signal to provide a scaled error signal; and the digital loop filter is configured to smooth the scaled error signal to provide the feedback envelope error signal.

18. The transmitter system of claim 17 wherein the first gain is a gain of the RF PA.

19. The transmitter system of claim 14 wherein the compensation block includes a first configurable digital gain block, a first summation node, a second configurable digital gain block, and a digital loop filter, wherein:

the first configurable digital gain block is configured to apply a first gain to the feedback output envelope to provide a scaled feedback output envelope;

the first summation node is configured to provide an error signal, which indicates a difference between the input envelope and the scaled feedback output envelope;

the second configurable digital gain block is configured to apply a second gain to the error signal to provide a scaled error signal; and the digital loop filter is configured to smooth the scaled error signal to provide the feedback envelope error signal.

20. The transmitter system of claim 19 wherein the first gain is an inverse of a gain of the RF PA.

21. The transmitter system of claim 13 further comprises an RF-to-baseband converter, wherein:

the RF-to-baseband converter is configured to convert the RF output signal from the amplifier output terminal of the RF PA into a feedback modulation signal fed to the baseband processor; and the DPD in the baseband processor is configured to provide a pre-distorted modulation signal based on comparing the input modulation signal from the modulator with the feedback modulation signal from the RF-to-baseband converter.

22. The transmitter system of claim 21 further comprises a baseband-to-RF converter, wherein:

the pre-distorted modulation signal is provided from the DPD in the baseband processor to the baseband-to-RF converter; and the baseband-to-RF converter is configured to convert the pre-distorted modulation signal to the RF input signal fed to the amplifier input terminal of the RF PA.

* * * * *